United States Patent [19]

Coryea et al.

[11] Patent Number: 4,959,607
[45] Date of Patent: Sep. 25, 1990

[54] RESTRICTOR FOR MULTIPLE SWITCH EXTERNAL CONTROL ACTUATOR FOR ELECTRONIC ENERGY METER

[75] Inventors: Peter F. Coryea, Salem; Warren R. Germer, Dover, both of N.H.

[73] Assignee: General Electric Company, Somersworth, N.H.

[21] Appl. No.: 411,963

[22] Filed: Sep. 25, 1989

[51] Int. Cl.$^5$ .............. G01R 11/64; G01R 11/24; H01H 3/00; G06C 15/42
[52] U.S. Cl. .............. 324/103 R; 200/18; 235/144 MA; 324/110; 324/116
[58] Field of Search ............ 324/103 R, 116, 110; 200/17 R, 18, 336, 570, 571; 235/144 MA

[56] References Cited

U.S. PATENT DOCUMENTS

| | | | |
|---|---|---|---|
| 2,304,596 | 12/1942 | Price | 235/144 MA |
| 3,586,974 | 6/1971 | Ham et al. | 324/103 R |
| 3,844,474 | 10/1974 | McQuarrie et al. | 324/103 R |
| 4,074,192 | 2/1978 | Hart | 324/103 R |
| 4,188,575 | 2/1980 | Palmer et al. | 324/103 R |
| 4,205,520 | 6/1980 | Shackford | 324/144 |
| 4,598,248 | 7/1986 | Germer | 324/103 R |
| 4,602,211 | 7/1986 | Losapio et al. | 324/103 R |

Primary Examiner—Ernest F. Karlsen
Attorney, Agent, or Firm—Robert F. Brunson; Irving M. Freedman

[57] ABSTRACT

An electronic energy meter is provided with a plurality of push button switches on the face of the meter which are selectively actuated by an actuator extending through the transparent cover to display various different meter functions. Switch restrictors are removably provided around a section of the actuator of selected switches which may then be readily actuated only from the inside of the meter, after unlocking and removing the cover.

34 Claims, 4 Drawing Sheets

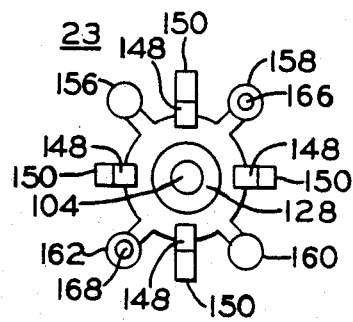
FIG_5A
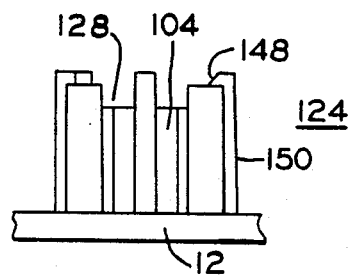
FIG_5B
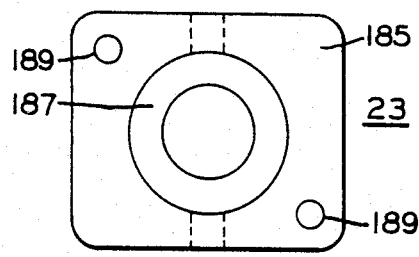
FIG_6
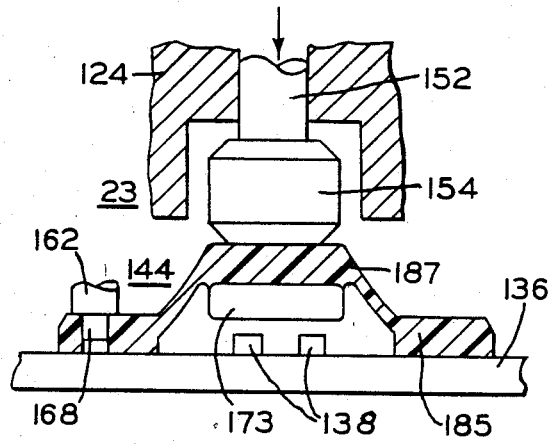
FIG_7
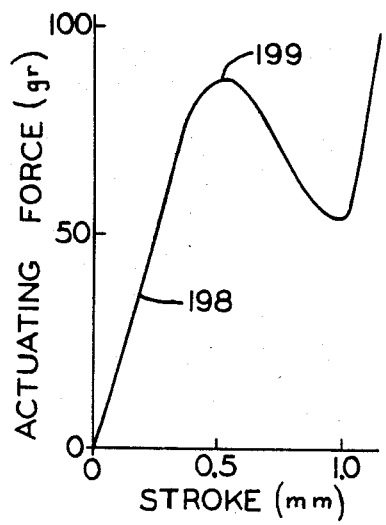
FIG_8
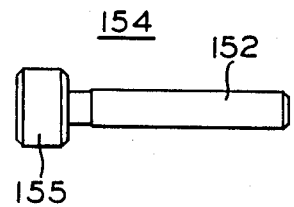
FIG_9

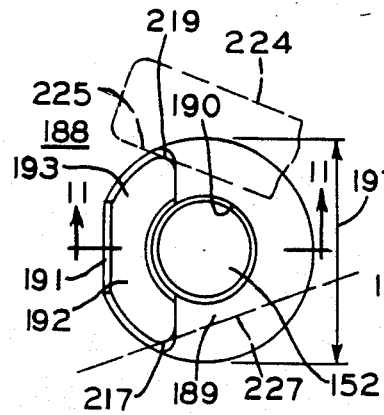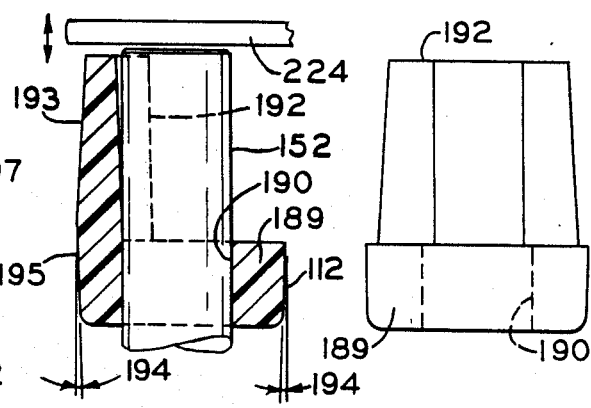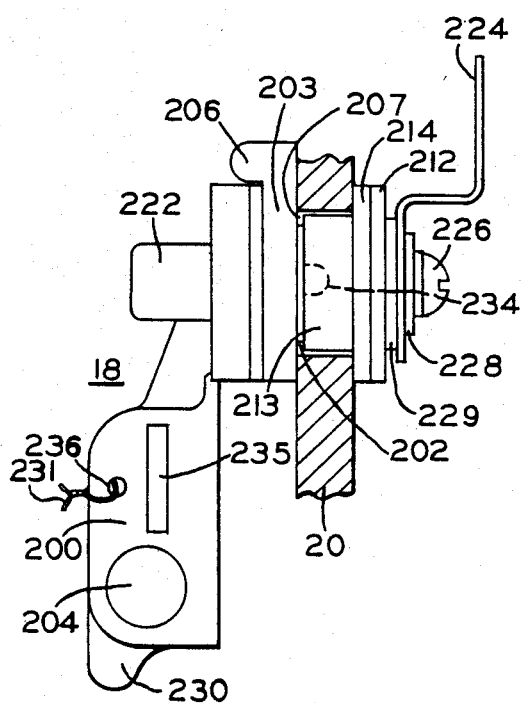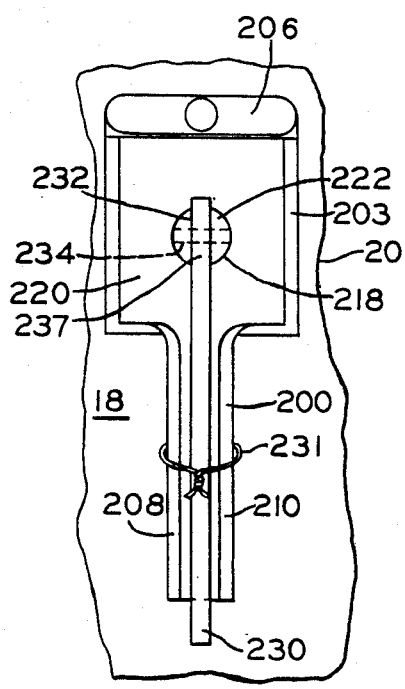
FIG.10    FIG.11    FIG.12
FIG.13    FIG.14

RESTRICTOR FOR MULTIPLE SWITCH EXTERNAL CONTROL ACTUATOR FOR ELECTRONIC ENERGY METER

BACKGROUND OF THE INVENTION

The present invention relates to electronic energy meters, and more particularly, to selectively restricting the access available from outside the meter to a plurality of functions and modes of operation which are available within the meter.

Watthour meters frequently include provisions to selectively provide additional functions such as kilowatt demand metering. Such meters provide an indication of the power consumed during the highest consumption period since the last time the accumulating registers were zeroed. Zeroing of the accumulating registers is conventionally performed manually from outside the meter by a meter reader in the performance of his normal duties. One type of mechanical demand meter is disclosed in U.S. Pat. No. 3,586,974.

Demand registers continue to be an integral part of the utility billing system since billing is based not only upon total kilowatthour consumption but also upon peak demand. The utility must provide generating capacity to meet peak demands placed on the system, and it is in the interests of the utility to minimize peak demands in order to avoid adding expensive spinning reserve power generation capabilities which may only be utilized for short periods of time. That is, it is important for a utility to smooth out peak demands whenever possible. This is accomplished by charges based on the peak demand of a customer in order to encourage the customer to average, or spread out over the day, the customer's heavy periods of consumption of electric power.

Since demand registers are an integral part of the utility billing system, prevention of tampering is necessary. The need for security against tampering is complicated however, since ready accessibility must be provided to permit the meter reader to read and reset the demand accumulating registers. A number of security arrangements for actuators have been proposed and/or used in the past. See, for example, U.S. Pat. Nos. 4,188,575 and 4,205,520, both of which are assigned to the same assignee as the present invention. These type of actuators include a key-lock barrel which passes through the meter cover. When unlocked with a key, the barrel may be pressed inward or rotated to engage an actuator in the register. The key can then be rotated to perform the zeroing or resetting action, after which the actuator is disengaged, and the key is removed to restore the mechanism to its locked condition.

A further type of demand register reset actuator is disclosed in U.S. Pat. Nos. 3,844,474 and 4,602,211 which utilize an external hinged lever to actuate the barrel. The lever may be hinged into alignment with the stationary locking plate and is securely held in an non-operative position by a lock or shackle passing through aligned holes in the lever and the locking plate.

In the above arrangements, the actuator and locking mechanism is positioned on, and passes through, the transparent cover of the meter. That is, it is important that the meter reader be able to perform desired functions without removing the cover and exposing dangerous electrical potentials.

The recent availability of low-cost electronic storage and processing devices, particularly digital processors such as microprocessors, has permitted the replacement of some of the mechanical functions of a demand register with electronic functions. In such electronic meters the necessity for resetting the demand register continues to exist. In addition, the expanded capability of electronic meters allows the meter to display other supplemental or alternate information and/or functions including, for example, self check and register display. However, the meter display, which typically is a liquid crystal display is not capable of simultaneously displaying all of the data or functions which may be provided and/or displayed. Also, since it is not desirable to continuously display all of such data, there is a continuing need for some type of switching mechanism in order to call up supplemental or alternate display material only when desired. However, this capability should not interfere with the routine reading and resetting which is periodically performed by the meter reader.

Energy meter customer requirements and desires vary as to which functions should be available to the meter reader who typically does not have access to the interior of the meter, and which functions should be available only to a serviceman or repairman who has such access. Energy meters must be built to provide the external control accessibility as required or demanded by the customer. However, building a variety of custom designs as required by various customers greatly increases the cost and complexity of the manufacture of energy meters, and the stocking of meters and spare parts. In addition, customer practices and requirements change from time to time such that it is desirable to provide the capability to readily change the accessibility of certain functions or controls available to the meter reader from outside the meter.

Security requirements continue to dictate the need to prevent tampering with such more flexible demand meters. Furthermore, the ease or ability with which an authorized person, such as a meter reader, may switch display information or modes of operation also continues to be important.

It thus remains desirable to perform at least some of the resetting and switching or control functions from outside the cover, while barring or preventing certain other switching or control functions from outside the cover, and at the same time providing the flexibility to readily change those switching or control functions which can be performed from outside the cover. One mechanism for accomplishing some of the above objectives, but which does not provide the flexibility or simplicity of the present invention, is disclosed in U.S. Pat. No. 4,602,211 issued July 22, 1986 to P. F. Losapio and W. R. Germer, and assigned to the same assignee as the present invention, which patent is hereby incorporated by reference.

OBJECTS AND SUMMARY OF INVENTION

Accordingly, it is an object of the present invention to provide a plurality of controls within an electronic energy meter which may be readily configured to permit actuation of a selected control or controls by an actuator mounted on, and extending through, the housing of the meter.

It is a further object of the present invention to provide a plurality of controls in an electronic energy meter which may be selectively reconfigured regarding which controls may be actuated by a cover mounted actuator, and which controls require that the cover be removed prior to actuation.

It is another object of the present invention to provide a versatile electronic energy meter which may readily configured at the time of manufacture, or subsequent thereto, to provide and/or limit those controls available for actuation by the meter reader.

In accordance with one embodiment of the present invention, a plurality of axially actuated switches are provided in an electronic meter to change the information being displayed, or to change the mode of operation of the meter. A lockable switch actuator includes an actuating paddle which can be selectively rotated into alignment with one of the axially actuated switches and pushed inwardly to depress and actuate the selected display and/or mode of operation. The switch actuator passes through the bore of a boss which includes a tapered annular ring having a flatted portion. A removable switch restrictor of generally C-shaped cross section with a flatted outer edge may be selectively inserted into the annular rim to surround the switch actuator to prevent operation by the actuating paddle depressing that switch actuator. An interference fit allows the switch restrictor to be firmly retained when inserted, yet readily removable from one or more of the switches.

The above and other objects, features and advantages of the present invention will become apparent from the following description read in conjunction with the accompanying drawings, in which like reference numerals designate the same elements.

BRIEF DESCRIPTION OF THE DRAWINGS

FIGS. 5A and 5B are enlarged views of the switch housing and switch retainers.

FIG. 6 is an enlarged top view of the switch.

FIG. 7 is an enlarged cross-sectional view of the switch actuator and switch shown in FIG. 4.

FIG. 8 is a plot of the switch stroke plotted against switch actuating force.

FIG. 9 is an enlarged view of the switch actuator.

FIG. 10 is an enlarged top view of a switch restrictor.

FIG. 11 is a front cross-section of FIG. 10 taken along lines 11—11 plus showing a portion of the manual rotary selector control FIG. 11 plus showing a portion of the manual rotary selector control and the switch actuator.

FIG. 12 is a side view of the switch restrictor of FIG. 10.

FIG. 13 is an enlarged side view of the manual rotary selector control of FIG. 1.

FIG. 14 is a top view of the rotary selector control of FIG. 13.

Referring to FIGS. 1 and 2, an electronic energy meter 10 includes a generally cylindrically shaped bezel 12 with a digital display window or meter readout 14 which comprises a liquid crystal display (LCD) positioned behind the bezel. The LCD readout normally displays the total watthour consumption of the load, home, or facility, the power lines of which are connected to, and through, the energy meter 10. Details of the construction of an electronic energy meter which incorporates the present invention are set forth in copending U.S. patent application, Ser. No. (411,934), filed Sept. 25, 1989 by W. R. Germer, M. J. Ouellette, D. F. Bullock and A. F. Palmer, assigned to the same assignee as the present invention, and hereby incorporated by reference.

Figure 1:
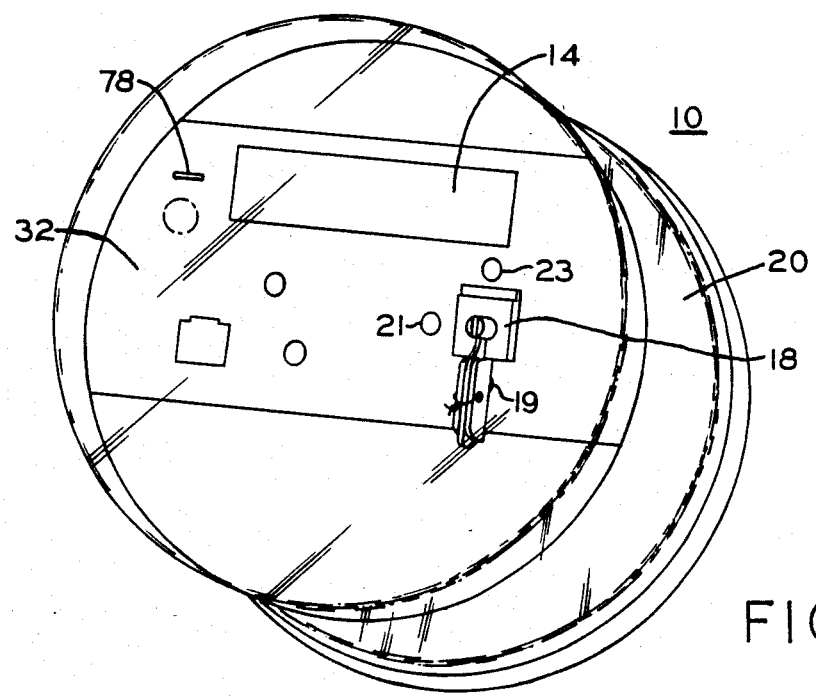
FIG. 1 shows an electronic meter incorporating the present invention.

The energy meter 10 includes the capability of displaying or providing a plurality of different types of information such as test function information, power consumption information and operational information. A rotary switch actuator 18 which is positioned on, and extends through, the transparent case 20 of the meter may be readily accessed and actuated by the meter reader to cause the meter to perform Monthly Reset, Display and/or Self Check functions with associated display of information through the depression by actuator 18 of plunger switches 19, 21, and 23. For details of the construction and operation of a rotary switch 18 suitable for use with the present invention, reference may be made to U.S. Pat. No. 4,602,211 issued July 22, 1986 to P. F. Losapio and W. R. Germer, and assigned to the same assignee as the present invention. The test operation of electronic demand registers is also described in detail in U.S. Pat. No. 4,598,248 issued July 1, 1986 to W. R. Germer and assigned to the same assignee as the present invention.

The switches 19, 21, and 23 each include a central aperture 100, 102, and 104, respectively, surrounded by generally annular groves 108, 110, and 112, respectively, each of which has a flatted angular positioning portion 116, 118, and 120, respectively.

Figure 2:
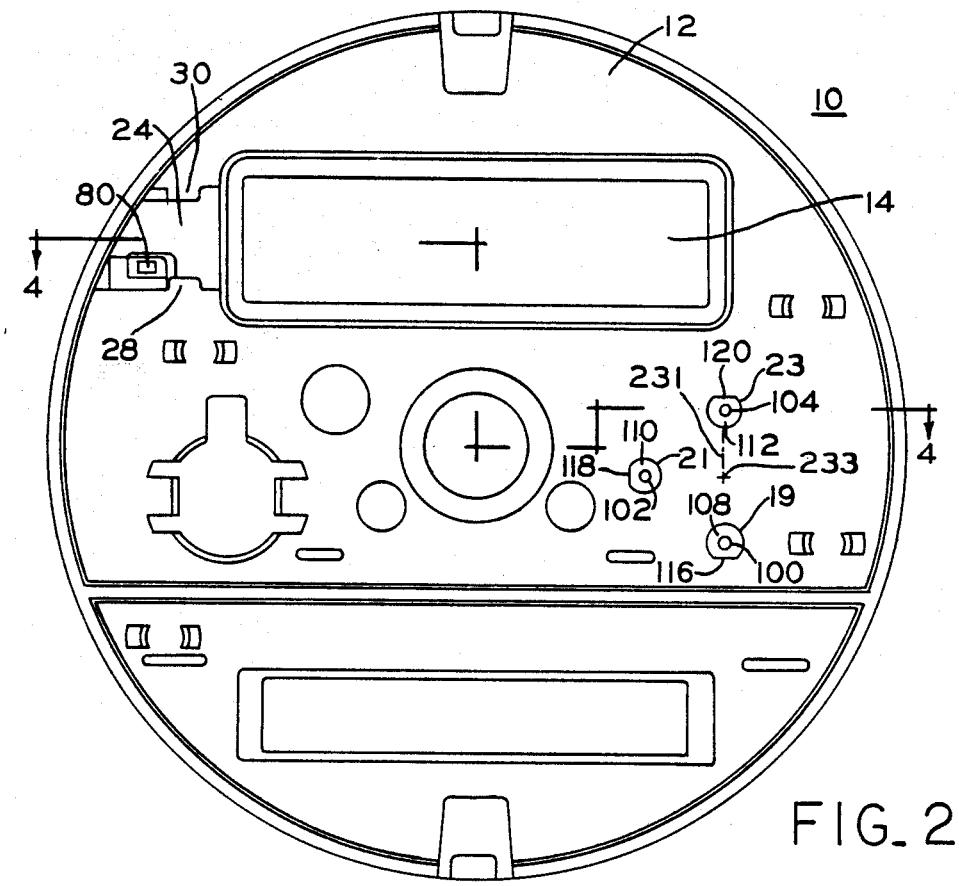
FIG. 2 is a top view of the bezel of FIG. 1
Figure 3:
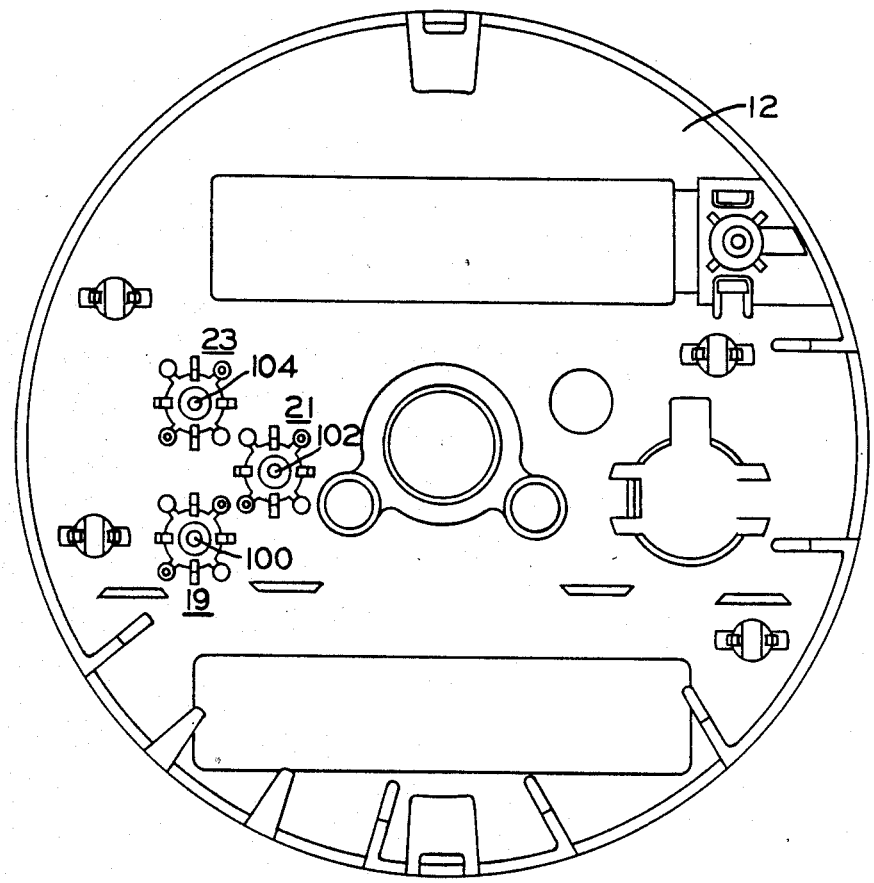
FIG. 3 is a bottom view of the bezel of FIG. 2.
Figure 4:
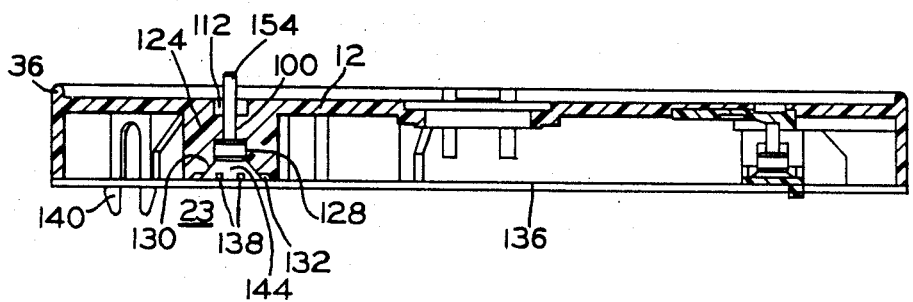
FIG. 4 is a cross-sectional side view of the bezel of FIG. 2 taken along the lines 4—4 in FIG. 2, and in addition includes a switch actuator and switch along with circuitry to be switched.

FIG. 3 shows the bottom view of the bezel 12, while FIG. 4 is a cross sectional side view taken along the lines 4—4 in FIG. 2 and in addition includes a switch actuator, switch and circuitry to be switched. FIGS. 5A and 5B are enlarged drawings of the boss which is integral with the bottom of the bezel 12 and which supports the plunger switches 19, 21 and 23. Referring to FIGS. 3, 4, 5A, and 5B, it is to be noted that the boss 124 associated with switch 23 extends below the bezel 12 to support the switch 23. The axial actuator 154 for switch 23 is movable within a central opening which includes (as best shown in FIG. 4) the generally annular groove 112 in the upper region and the central aperture 100 in the middle region, below which is a cylindrical opening 128 leading to a generally conical bottom 130 which flares out from the cylindrical middle region and includes a groove 132 at the bottom. A circuit board 136, having a plurality of conductors 138 on the surface thereof, is secured to the bottom of the bezel 12 by a plurality of support members 140.

A rubber contact switch 144 (see FIG. 7) is positioned above the printed wiring board 136 in the conical bottom section 130 of boss 124. The rubber contact switch provides the resiliency which supports the axial actuator 154 in the position shown in FIG. 4 which is the "Off" position, that is the contact carried underneath the top of the switch 23 is separated from the conductors 138 on printed wiring board 136. The structure and operation of the rubber contact switch is shown in better detail, and is discussed below, in connection with FIGS. 6, 7, 8, and 9.

FIGS. 5A and 5B show the details of boss 124. Referring to FIGS. 5A and 5B, and also to FIGS. 3 and 4, it is to be noted that the conical bottom 130 is formed by the sloping surfaces 148 of the four vertical supports 150 which are equally spaced about the boss 124. The sloping surfaces 148 are at an angle of approximately 45 degrees to form the conical region 130 between them to support the rubber contact switch 144 as described in more detail below. Interposed between the vertical supports 150 are four cylindrical posts 156, 158, 160 and 162. Diametrically opposed cylindrical posts 158 and 162 include central extension portions 166 and 168 to which holes in the rubber contact switch 144 are secured to position the rubber contact switch within the conical bottom 130.

The details of the construction and operation of the rubber contact switch 144 is best understood with reference to FIGS. 6, 7 and 8. Referring first to FIGS. 6 and 7, the switch 23 includes a generally rectangular shaped base 185, and a cup shaped central region 187, best shown in FIG. 7. A pair of mounting holes 189 are positioned adjacent opposite corners, to facilitate the mounting of the switches to the central extension portions 166 and 168 of posts 158 and 162. A conductive segment or button 173 is positioned inside the cup shaped central region 187. Downward movement of the axial actuator 154, as shown by the arrow in FIG. 7, compresses the cup shaped central region 187 of the switch 23 such that conductive button 193 moves into contact with, and bridges, the conductors such as 138 on the circuit board 136. (See FIGS. 4 and 7)

FIG. 8 shows a plot of the stroke or movement of the conductive button 193 of switch 23 in millimeters, plotted against the actuating force in grams applied through the axial actuator 154. Referring to FIG. 8, it is seen from the plot 198 that increased actuating force provides linear movement of the switch and the conductive button 193 until the region 199, where the rubber cup shaped central region 187 is depressed sufficiently to provide a snap action such that increased stroke is obtained with decreased actuating force. That is, the rubber cup shaped central region 187 snaps downward to provide positive snap action switching.

FIG. 9 shows the axial actuator 154 which includes a shaft 152 which is rotatably mounted within the central aperture 104 and a cylindrical portion 155 which is slidably supported within the cylindrical opening 128 of boss 124, and contacts the cup shaped central region 187 of the rubber contact switch 144. The ends of the axial actuator 154 along with the inner end of the cylindrical portion 155 are chamfered and there is a slight necking down of the shaft 152 in the region of the cylindrical portion 155.

As discussed above, it is desirable to provide a capability to operate one or more of the plunger switches 19, 21 and 23 from outside the cover 10, while at the same time to be selectively able to limit the actuation of one or more of the switches to actuation only with the cover removed. That is, the customer may designate which of the switches to be operable by the meter reader from outside the cover 10, and which of the switches are to be operable only by the repairman or serviceman who is authorized to, and has the ability to, remove the cover to test and service the meter with the cover removed. Also, it is desirable to provide flexibility to allow the customer or serviceman to selectively change those switches available to the meter reader from outside the cover by changing the mechanism which restricts the operation of the selected one or more switches.

The switch actuator which enables actuation of preselected switches by the meter reader from outside the cover 10 is shown in FIGS. 13 and 14, while the switch restrictors are shown in FIGS. 10, 11, and 12. Referring first to FIGS. 13 and 14, the rotary switch actuator 18 includes a U-shaped stationary member 200 positioned on the outside of the cover 20 attached to a threaded barrel 202 which passes through a locking member 203 and a hole 204 in cover 20. The locking member 203 is generally rectangular in shape with a lip 206 which extends perpendicular to the cover 20. The U-shaped stationary member 200 includes a pair of upwardly extending arms 208 and 210 and a rectangular flatted portion 220 which is positioned on the rectangular portion of locking member 203 and is prevented from rotating by the lip 206. The locking member 203 is securely fastened to the cover 20, by ultrasonic welding to prevent any rotation of the U-shaped stationary member 200. If a glass cover 20 is provided, locking member 203 may be eliminated and replaced by a ridge alongside the upper edge of stationary member 200, with the ridge molded in the glass to prevent rotation of the stationary member. An appropriate nut 212 having an axial extension 213 into the cover 20 is separated from the cover by a resilient washer 214. When the nut 212 is secured, and with the rotary switch actuator 18 is in the off position shown in FIGS. 13 and 14, washer 214 provides a seal against the inside of the cover around the threaded barrel 202. An actuating rod 222 is slidably positioned in a bore 218 within the threaded barrel 202, and includes a paddle 224 extending radially outwardly and secured to the actuating rod by a screw 226 and washer 228. The actuating rod 222 is slidably secured within the threaded barrel 202 and is also rotatable such that the paddle 224, at the end thereof, is movable in a direction away from the transparent cover 20 and rotatable. An actuating arm 230 is positioned within the upwardly extending arms 208 and 210 and connects to the actuating rod 222 through a slot 232 and a pin 234 which passes through the actuating rod 222 within the threaded barrel 202. Aligned openings including holes 204, slots 235, and smaller holes 236 in the upwardly extending arms 208 and 210 of the U-shaped stationary member 200, and also in the actuating arm 230 provide locking apertures through which a locking member or sealing wire such as 231 may be passed in order to lock the rotary switch actuator in the position shown in FIGS. 13 and 14.

Upon the removal of the locking member 235, the actuating arm 230 may be rotated upwardly about the pin 234 allowing the pivoted end of the actuating arm 230 which is narrowest in the region 237 adjacent the bore 218 to pivot and slide through the bore, enabling the paddle 224 to extend into the interior of the energy meter 10 to contact the upper ends of plunger switches 19, 21, and 23 shown in FIG. 2. These switches are arranged in a circular arc about the axis of rotation 233 of the rotary switch actuator 18 as best shown in FIG. 2. Return of the actuating arm 230 to the position shown in FIGS. 13 and 14 and pivotal motion of actuating arm 230 about pin 234 moves the actuating rod 222 upward, and forces the paddle 224 and the resilient washer 229 against the nut 212 to provide a substantially waterproof seal for the bore 218, and the actuating arm 230 may again be locked in position through a locking member passing through holes 204 or 236.

Thus, the paddle 224 on the end of the actuating rod 222 may be rotated to be selectively positioned above plunger switches 19, 21 or 23 (as shown in FIG. 11) and then depressed to actuate the selected switch. However, if a switch restrictor 188 is positioned on a plunger switch, the paddle 224 is prevented by the restrictor from depressing that plunger switch.

Referring next FIGS. 10–12, the switch restrictor 188 is made of a Lexan polycarbonate and includes a base 189 with a central aperture 190 which is dimensioned to enable the shaft 152 of axial actuator 154 to pass through and slide within the aperture. An axially extending C-shaped restrictor 192 has a flatted central portion 193 extending upwardly. The base 189 of the switch restrictor 188 has a slight taper 194 of 1.5 to 2.5 degrees. The base 189 including its flatted portion 191 is dimensioned to provide a tight fit within the annular groove 112 around the axial actuator 154 (best shown in FIGS. 4 and 11) which passes through the central aperture 104 of switch 23 (best shown in FIG. 2). The maximum diameter 197 of the tapered base 189 is 0.225–0.228 inches. The diameter of the generally annular groove 112 in which the base 189 fits (see FIG. 2) is 0.221–0.223 inches and the annular groove 112 of the base has a taper of 2.5 degrees. Thus, there is an interference fit as the tapered base 189 is pressed into the annular grove 112 around the shaft 152 of the axial actuator 154. This provides a firm positive holding action for the restrictor 188 about the shaft 152.

The purpose of the flatted angular positioning portions 116, 118 and 120 in annular grooves 108, 110 and 112, respectively, is to obtain proper orientation of the central portion 193 of the switch restrictors 188 relative to the paddle 224 of the rotary switch actuator 18 as best shown in FIGS. 2, 10 and 11. Referring to FIGS. 2, 10 and 11, it is to be noted that the flatted portions 116, 118 and 120, through the flatted portions 191 of the base 189 position the flatted central portions 193 of the switch restrictors 188 substantially perpendicular to a radial line from the axis of rotation 233 to the flatted portions, such as radial line 235 extending from the axis of rotation to the flatted portion 120 of plunger switch 23. This places the flatted central portions 193 of the switch restrictors 188 directly in line with paddle 224 of the rotary switch actuator 18 as it is rotated to, or past, shaft 152. More important, the portion of the shaft 152 not surrounded by the central portion 193 (see FIG. 10) is also simultaneously in line with the paddle 224 such that the paddle 224 always encounters the central portion of the switch restrictor 188 when passing over the shaft. As shown in FIG. 10, the paddle 224 rotates past the shaft 152 before it clears the central portion 193 of the switch restrictor 188 as indicated by edge 225 of paddle 224. The shaft 152 is within the pie shaped segment formed by a radial plane 227 about the axis of rotation 233 of the rotary switch actuator 18 to the edges 217 and 219 of the C-shaped central portion 193. That is, the paddle 224 cannot be depressed onto shaft 152 without encountering the C-shaped axially extending central portion 193 of a switch restrictor selectively positioned around one or more of switches 19, 21 and 23. However, if switch restrictor 188 were rotated, for example, 20 or 30 degrees counterclockwise, the paddle 224 could be positioned over, and depress to actuate, the shaft 152 of the switch without encountering the central portion 193 of the switch restrictor. Accordingly, the angularly positioning flatted portions 116, 118 and 120 in annular grooves 108, 110, and 112, respectively, orient the switch restrictors 188 to preclude any inadvertent orientation in which the paddle 224 could contact and depress the shafts of the switches 19, 21, and 23, such as shaft 152, if a switch restrictor is present at that switch. The angular positioning of the switch restrictors is shown and described as provided by the flatted portions 116, 118 and 120 of annular grooves 108, 110 and 112 respectively, cooperating with the flatted portions 191 of the switch restrictors 188. However, other mating angular positioning combinations could be provided, such as projections and mating openings associated with the grooves and switch restrictors having triangular, rectangular or other cross section. The mating flatted portions for the grooves 108, 110 and 112 and for the switch restrictors 188 have proven to be readily manufacturable even with the associated tapers such as taper 194 of the switch restrictors.

Thus, the switch restrictor 188 restricts or prevents depression of shaft 152 of switch 23 by paddle 224. However, with the meter cover 20 removed, a sufficient portion of shaft 152 is available and not surrounded by a central portion 193 (see FIGS. 10 and 11) to allow manual depression by the serviceman.

The restrictor 188 can be later removed, if desired or necessary, to change the ability of the meter reader to actuate the switch 23 from outside the meter. In addition, those switches which are made accessible to the meter reader from outside the meter may be selectively changed by the customer after delivery or even while the meter is installed and in use. For example, switch 23 might be made accessible to the meter reader while switch 19 and/or switch 21 might be restricted from actuation by the selective insertion of a switch restrictor 188 into grooves 108 and/or 110, respectively.

While separate rubber contact switches such as switch 144 in FIG. 7, are described in connection with the three switches 19, 21, and 23 shown in FIG. 3, it is possible to utilize a single rubber contact switch arrangement in which all three rubber contact switches are fabricated as a single member, simplifying and facilitating the installation of the three as a unit, rather than separately mounting each of the three. Also, it is possible to provide additional switches and switched displays and/or functions by locating additional switches under the surface covered by rotation of paddle 224 of rotary switch actuator 18 about its axis of rotation 233.

Thus, while the present invention has been described through preferred embodiments, such embodiments are provided by way of example only. Numerous variations, changes and substitutions, including those discussed above, will occur to those skilled in the art without departing from the scope of the present invention and following claims.

What we claim is:

1. A switching mechanism for an electric energy meter having a transparent cover, a display, and a plurality of switches within said energy meter below said cover which may be selectively actuated from outside said cover to display selected information unless actuation is precluded by a switch restrictor comprising:

a plurality of switches disposed in a pattern within said energy meter and below said transparent cover;

an actuating mechanism including a switch actuator positioned on said transparent cover, extending into said energy meter and including means to move said switch actuator into contact with an axial shaft of a selected one of said plurality of switches;

each of said switches being actuated by depressing the axial shaft associated with the switch;

one or more selectively positionable switch restrictors positioned about the axial shafts of one or more of said switches to prevent said switch actuator from depressing said switch;

a groove within said meter surrounding at least a substantial portion of each of said axial shafts and spaced from the end of the axial shaft adjacent said switch actuator;

said switch restrictor having a first portion thereof which surrounds only a segment of said axial shaft, and a second portion which is dimensioned to fit within, and to be secured by, each said groove;

said restrictors being selectively removable from, and positionable about, one or more of said switches;

each of said restrictors when positioned around one of said switches precluding the depressing of such one of said switches by said switch actuator from outside said transparent cover while not precluding the depressing of said one of said switches from within said transparent cover;

whereby said switch restrictors enable selective restriction of the actuation of said switches from outside said transparent cover, while enabling actuation of all of such switches when said transparent cover is removed.

2. The switching mechanism with selective restriction of one or more of said switches of claim 1 wherein said meter includes a bezel within said transparent housing, and said axial shafts of said switches pass through apertures in said bezel.

3. The switching mechanism with selective restriction of one or more of said switches of claim 2 wherein the grooves which surround the axial shafts are provided in the surface of said bezel around each aperture and adjacent to said switch actuator.

4. The switching mechanism with selective restriction of one or more of said switches of claim 3 wherein said grooves and said second portion of each of said restrictor have substantially mating portions to angularly position said restrictor about its associated axial shaft.

5. The switching mechanism with selective restriction of one or more of said switches of claim 4 wherein the first portion of each of said restrictors is C-shaped to encircle a portion of said shaft extending above said bezel toward said switch actuator.

6. The switching mechanism with selective restriction of one or more of said switches of claim 5 wherein said C-shaped portion encircles less than 180 degrees around the shaft it is positioned about.

7. The switching mechanism with selective restriction of one or more of said switches of claim 6 wherein said second portion of said restrictor is tapered inwardly away from the region where said second portion connects to said first portion.

8. The switching mechanism with selective restriction of one or more of said switches of claim 7 wherein said grooves are tapered inwardly from the surface of said bezel.

9. The switching mechanism with selective restriction of one or more of said switches of claim 8 wherein the taper of said second portion of each of said restrictors and said grooves is in the order of 1.5 to 2.5 degrees.

10. The switching mechanism with selective restriction of one or more of said switches of claim 9 wherein there is an interference fit between said second portion of each of said restrictors and said grooves in said bezel.

11. The switching mechanism with selective restriction of one or more of said switches of claim 10 wherein said bezel and said restrictors are plastic.

12. The switching mechanism with selective restriction of one or more of said switches of claim 4 wherein each of said restrictors encircles at least a portion of said axial shaft with which it is associated, and is removable by the application of pressure in a direction away from the groove encircling said axial shaft with which it is associated.

13. The switching mechanism with selective restriction of one or more of said switches of claim 12 wherein said switch actuator rotates within said transparent housing and includes an axially depressible paddle to activate a selected one of said switches when said paddle is rotated over the shaft of the selected one of said switches which is not encircled by a restrictor and then is depressed.

14. The switching mechanism with selective restriction of one or more of said switches of claim 13 wherein said switch actuator includes a member affixed to said transparent cover, and an actuating arm, each of which include mating openings through which a locking member may be inserted to lock said switch actuator in an inoperative position.

15. The switching mechanism with selective restriction of one or more of said switches of claim 12 wherein each said switch includes a rubber contact member which provides resiliency and a snap action to the switch actuation.

16. The switching mechanism with selective restriction of one or more of said switches of claim 15 wherein said rubber contact member is positioned in a conical cavity on the bottom of said bezel, and extends between said conical cavity and a printed circuit board positioned adjacent to the bottom of said bezel.

17. The switching mechanism with selective restriction of one or more of said switches of claim 16 wherein depression of said rubber contact member by said switch actuator through said shaft presses the contacts of said rubber contact member to bridge conductors positioned on said printed circuit board adjacent to said rubber contact member.

18. Selective switch restrictors for an electronic energy meter including a plurality of switching functions only some of which may be selectively made available for actuation by a meter reader from the outside of the meter comprising:

a transparent housing including a switch actuator fastened thereto with an actuating arm outside said transparent housing, and a depressible and rotatable actuating member inside said transparent housing;

a bezel inside said transparent housing including a surface adjacent said actuator member;

a plurality of switches positioned on said bezel around the axis of rotation of, and below, said rotatable actuating member;

an axially depressible shaft for each of said switches extending through openings in said bezel below the arc of rotation encompassed by said actuator member such that said actuator member may be selectively rotated above said shaft for each of said switches, and then depressed to depress the selected shaft for actuation of the switch associated with that shaft;

an annular groove substantially encircling each said shaft;

one or more switch restrictors each positionable in a selected annular groove;

said one or more restrictors each comprising a fastening portion fitting snugly within said annular groove to retain said restrictor in place within said groove, and a C-shaped vertical extension surrounding a portion of said shaft and extending upward from said bezel a substantial portion of the distance that shaft extends upward from said bezel in its switch off position;

each of said restrictors preventing said actuator member from depressing the shaft that it is associated with to its on switch position.

19. The selective switch restrictors for an electronic energy meter of claim 18 wherein said annular grooves include a tapered portion which mates with a tapered portion on the fastening portion of said switch restrictors.

20. The selective switch restrictors for an electronic energy meter of claim 19 wherein said switch restrictors are dimensioned to provide a firm interference fit within said annular grooves.

21. The selective switch restrictors for an electronic energy meter of claim 20 wherein said fastening portion of said switch restrictors and said annular grooves each include mating portions which provide angular positioning of said restrictors in said grooves relative to said axis of rotation of said rotatable actuating member.

22. The selective switch restrictors for an electronic energy meter of claim 21 wherein said annular grooves and said switch restrictors are tapered inwardly toward the bottom of said bezel.

23. The selective switch restrictors for an electronic energy meter of claim 21 wherein the tapers of said annular grooves and said restrictors are in the order of 1.5 to 2.5 degrees.

24. The selective switch restrictors for an electronic energy meter of claim 23 wherein said rubber contact switch is positioned below each of said shafts within a cavity formed between the bottom of said bezel and a circuit board positioned adjacent the bottom of said bezel.

25. The selective switch restrictors for an electronic energy meter of claim 24 wherein said rubber contact switch is generally conical in shape with a flatted portion adjacent said bezel, and includes the rubber contact inside the conical shape at said flatted portion, whereby said conical shape resiliently urges said shaft away from said circuit board.

26. The selective switch restrictors for an electronic energy meter of claim 25 wherein a plurality of conductors are supported on said printed wiring board adjacent, and separated from, said contact when the switch is in its off position.

27. The selective switch restrictors for an electronic energy meter of claim 26 wherein pressure applied to said shaft by the depressible and rotatable actuator member moves said contact against the resiliency of said conical shape to bridge the conductors supported on said circuit board to the on position of said switch.

28. The selective switch restrictors for an electronic energy meter of claim 27 wherein said conical shape of said rubber contact switch provides a snap action for said switch.

29. The switching mechanism for selective restriction of one or more of said switches of claim 21 wherein each said shaft lies within the pie shaped segment defined by a radial plane about the axis of rotation of said rotatable actuating member and between the ends of said C-shaped vertical extension.

30. The switching mechanism for selective restriction of one or more of said switches of claim 29 wherein said mating portions which provide angular positioning of said restrictors are flatted portions.

31. The switching mechanism for selective restriction of one or more of said switches of claim 30 wherein said flatted portions of said switch restrictors are substantially perpendicular to a radial plane about the axis of rotation of said rotatable member to the central region of said flatted portions 32. The switching mechanism for selective restriction of one or more of said switches of claim 4 wherein said shaft lies within the pie shaped segment defined by a radial plane about the axis of rotation of said rotatable actuating member and the ends of said C-shaped vertical extension.

33. The switching mechanism for selective restriction of one or more of said switches of claim 32 wherein said mating portions are flatted portions.

34. The switching mechanism for selective restriction of one or more of said switches of claim 33 wherein said flatted portions are substantially perpendicular to a radial plane about the axis of rotation of said rotatable member to the central region of the flatted portion.

* * * * *